United States Patent [19]
Falbel

[11] Patent Number: 6,034,319
[45] Date of Patent: Mar. 7, 2000

[54] IMMERSED PHOTOVOLTAIC SOLAR POWER SYSTEM

[76] Inventor: Gerald Falbel, 472 Westover Rd., Stamford, Conn. 06902

[21] Appl. No.: 09/126,505

[22] Filed: Jul. 30, 1998

[51] Int. Cl.[7] .................................................. H01L 25/00
[52] U.S. Cl. .............................................. 136/246
[58] Field of Search .............................................. 136/246

[56] References Cited

U.S. PATENT DOCUMENTS

| | | | |
|---|---|---|---|
| 5,261,970 | 11/1993 | Landis et al. | 136/259 |
| 5,449,413 | 9/1995 | Beauchamp et al. | 136/257 |
| 5,665,174 | 9/1997 | Laing et al. | 136/246 |

*Primary Examiner*—Mark Chapman
*Attorney, Agent, or Firm*—Mark P. Stone

[57] ABSTRACT

An immersed solar concentrator system has a concentrator element for directing light rays onto a solar cell. The solar cell has a surrounding reflective surface for reflecting light rays which are not absorbed by the solar cell but strike the reflective surface. The immersion medium, which is disposed between the solar cell and the concentrator element, has a refractive index for reflecting the reflected light rays, by total internal reflection, in a direction towards the solar cell so that at least some of the reflected light rays are absorbed by the solar cell.

20 Claims, 6 Drawing Sheets

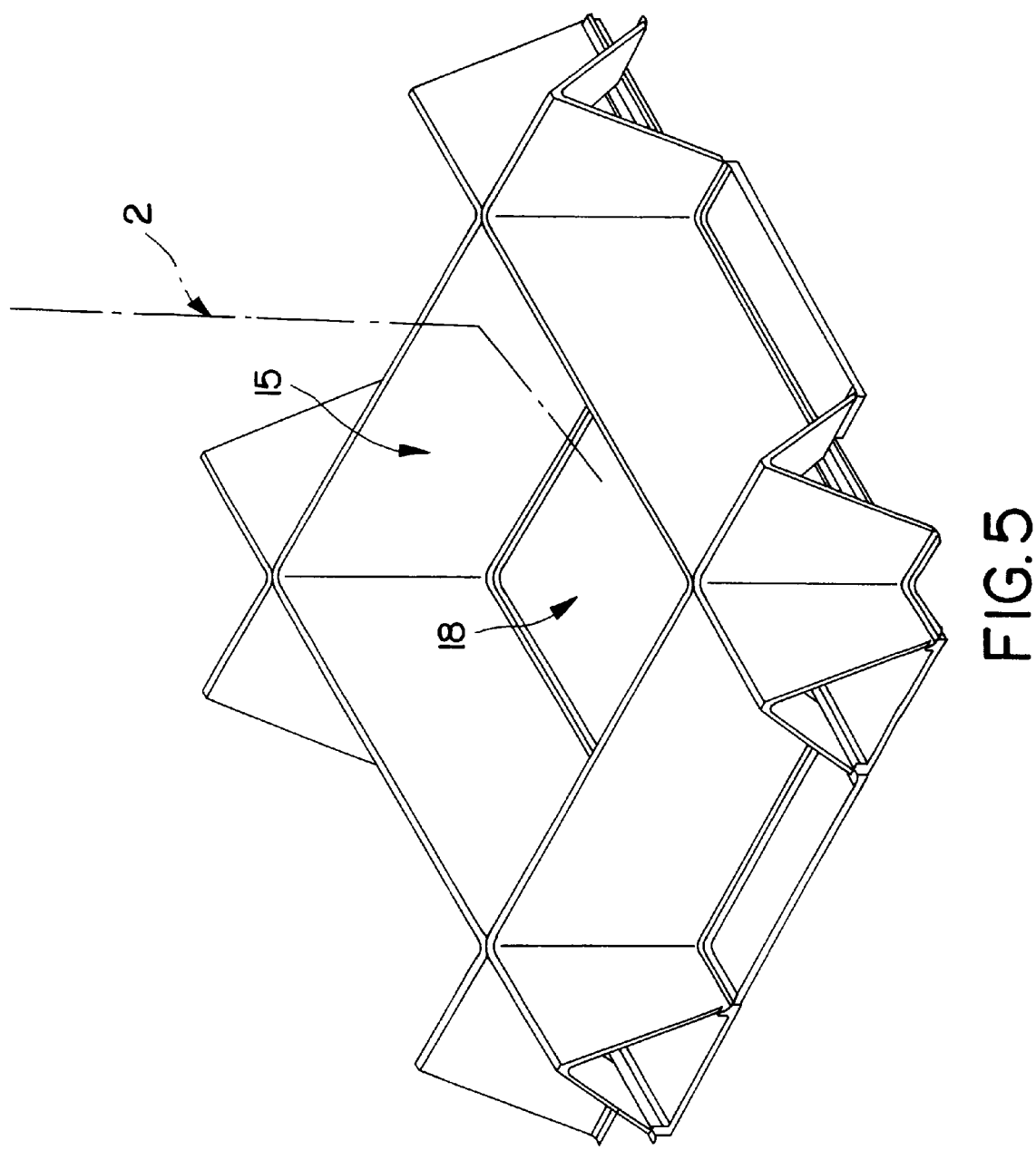

6,034,319

1

IMMERSED PHOTOVOLTAIC SOLAR POWER SYSTEM

BACKGROUND OF THE INVENTION

Known concentrating elements used in solar power systems, particularly folded mirror systems in which air or vacuum is disposed between the concentrating elements, produces obscuration resulting from a secondary folding mirror, such as that employed in a classic "Cassegrainian" system in which a parabolic concave primary mirror converges light onto a hyperbolic convex secondary mirror which redirects that light to focus near the center of the primary mirror. The secondary mirror is opaque, thereby resulting in obscuration of some of the rays, causing loss of optical energy reaching the focal plane.

It is a primary object of the solar power system in accordance with the present invention to modify a "Cassegrainian"-type fused silica concentrator system by employing an immersion media which, through the use of the phenomenon of total internal reflection, minimizes or eliminates obscuration and achieves a wide field of view to ease the tracking requirements for a solar panel.

Other objects and advantages of the solar power system in accordance with the present invention will become apparent from the following description thereof.

SUMMARY OF THE INVENTION

An immersed photovoltaic concentrating solar power system includes a solar cell for converting light energy into electrical energy, and an optical concentrator element for focusing incoming light rays onto the photocell. A reflective surface is provided proximate to the photocell for reflecting incoming light rays which are not focused on and absorbed by the solar cell, in a direction towards the concentrator element. An immersion medium, such as silicone, is disposed between the solar cell and the optical concentrator element (which can be formed from fused silica), such that the solar cell is immersed in the immersion medium. The optical element on which the solar cell is immersed is selected such that its refractive index will, as a result of the phenomenon of total internal reflection, redirect at least some of the light rays reflected from the reflective surface, in a direction towards the solar cell for absorption by the solar cell. Obscuration is significantly reduced or eliminated since rays which are directly impinging initially on the solar cell are absorbed by the solar cell, and rays which initially are not impinging on the solar cell are reflected and redirected onto the solar cell and are absorbed therein.

In a first embodiment of the invention, the solar panel is designed as a generally square "honeycomb" flat grid pattern, while a second embodiment of the invention employs a pyramidal concentrator which reduces the total number of cells per panel.

2

Figure 3:
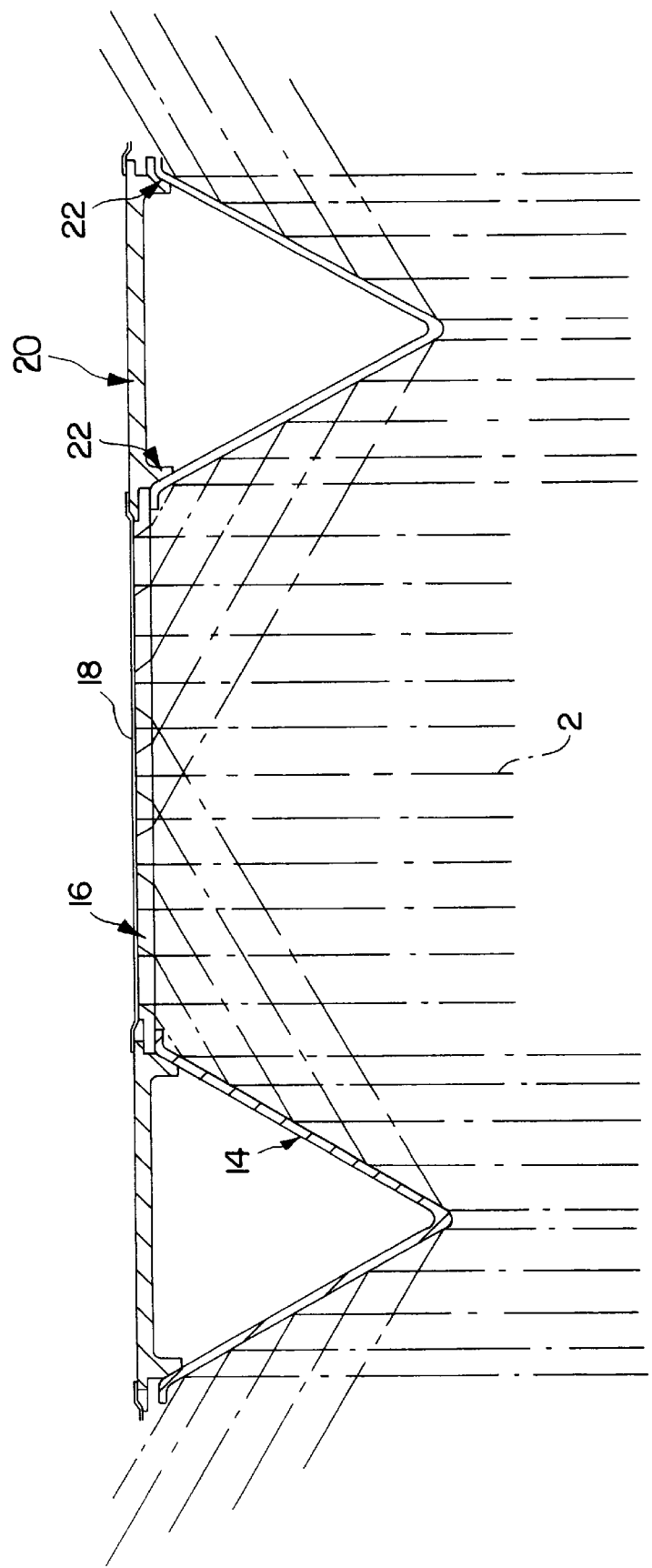
Figure 4:
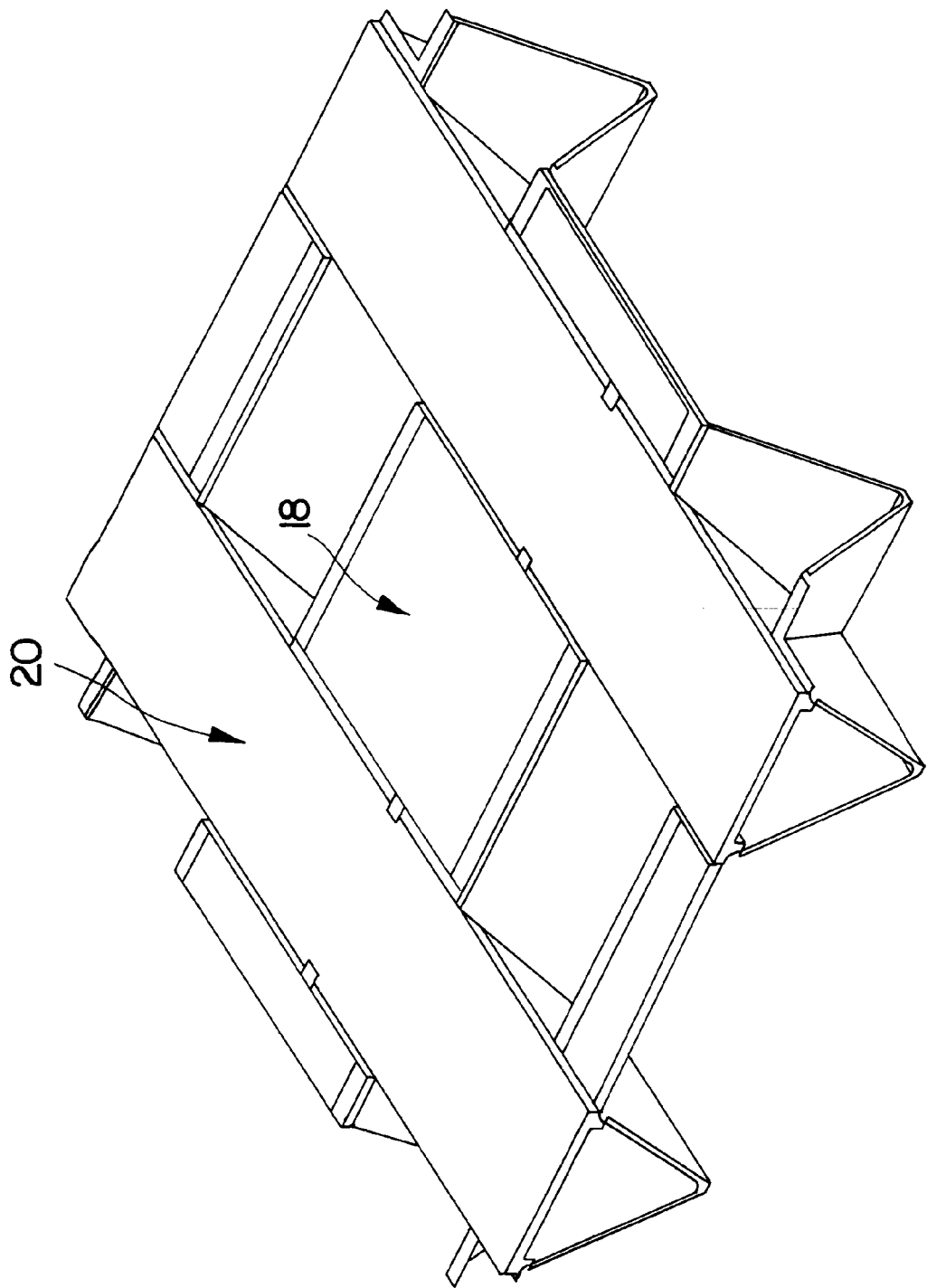
Figure 6B:
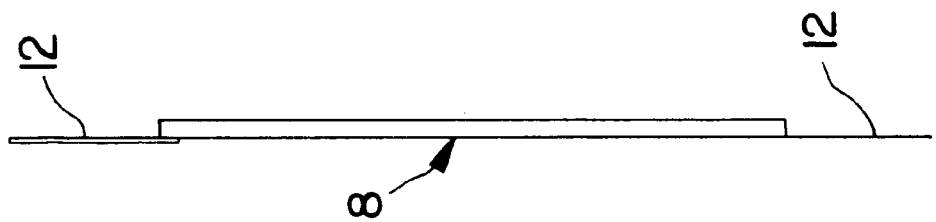
Figure 6A:
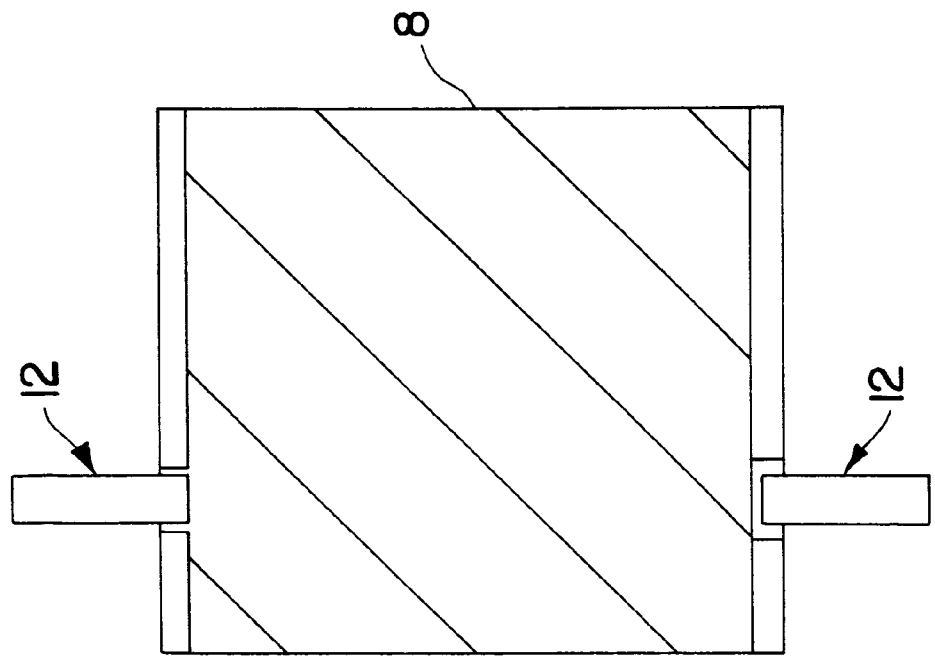

FIG. 3 illustrates, in section, a solar powered system in accordance with a second embodiment of the present invention;

FIG. 4 illustrates a perspective view, looking towards the rear of a solar power system in accordance with the second embodiment of the present invention;

FIG. 5 illustrates a perspective view, looking towards the front of a solar power system in accordance with the second embodiment of the present invention; and FIG. 6 illustrates a schematic view of a solar cell in accordance with both the first and second embodiments of the present invention illustrating positive and negative electrical connector leads mounted to the solar cell.

DESCRIPTION OF THE BEST MODES FOR CARRYING OUT THE INVENTION

Recent advancements in photovoltaic solar cells from Gallium Arsenide (GaAs) have shown that with concentration ratios greater than one solar constant, overall efficiencies up to 23% can be achieved. A second issue applicable to solar power systems for spacecraft is the cost driver, which requires that the efficiency/weight ratio be improved so that solar panels with high output, weighing less, will reduce payload weights, which in turn, reduces launch costs. This has results in a "Figure of Merit" being introduced to grade the characteristics of solar panels for spacecraft. This "Figure of Merit" defines a ratio of watts/kilogram for a solar panel. Typical flat plate panels on current spacecraft, fabricated with silicon solar cells without concentration, provide "Figures of Merit" of 25 to 30 watts/Kg.

The present invention is directed to a new design of a 1.9/1 solar concentrator in which conservative calculations show improvements on this "Figure of Merit" by a major factor (3 to 4). An alternative 2.88/1 concentrator configuration using larger GaAs cells, thereby greatly reducing the number of cells per panel, and thereby reducing the complexity of the solar panel assembly, is also discussed and has been analyzed to show an equivalent "Figure of Merit".

The proposed flat solar panel is a mosaic arrangement of modular 5 mm.×5 mm. GaAs cells in a rectangular "honeycomb" type grid which performs the triple function of:

1. Optical Concentrator;
2. Basic structure for the Solar Panel, having a thickness of ⅕ of current solar panels; and
3. Current carriers for the solar power generated by the cells.

The cells are optically immersed in a "Cassegrainian-type" fused silica concentrator which, through the use of total internal reflection, produces no obscuration and achieves a wide field of view to ease the tracking requirements for the solar panel.

The "Figure of Merit" for this design has been computed to be >126 watts/Kg., or over four times the current capabilities of the best flat plate solar panels for spacecraft.

A second design is also presented which uses a stamped, thin wall pyramidal reflective concentrator on an immersed solar cell, allowing larger cells and fewer cells per panel. This design has a "Figure of Merit" computed to be up to 158 watts/Kg, when magnesium is used for the pyramidal concentrator optic.

The panel in either design is designed for an automated assembly process necessary in order to reduce the cost. The proposed automated fabrication assembly process, based upon current "Pick and Place" PC board assembly technology, is also discussed, as is the Van Allen radiation survivability of this design.

Description of Design No. 1 (5 mm.×5 mm. GaAs Cells)

Figure 1B:
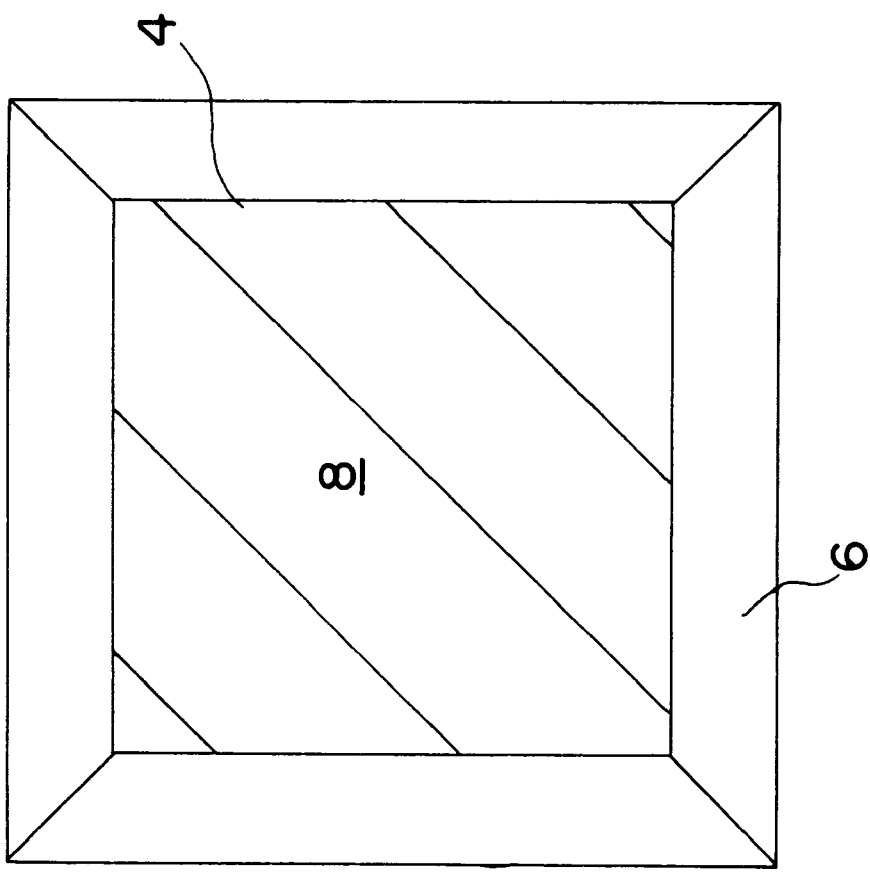
FIG. 1B illustrates a front elevational view of FIG. 1A, in accordance with a first embodiment of the present invention.
Figure 1A:
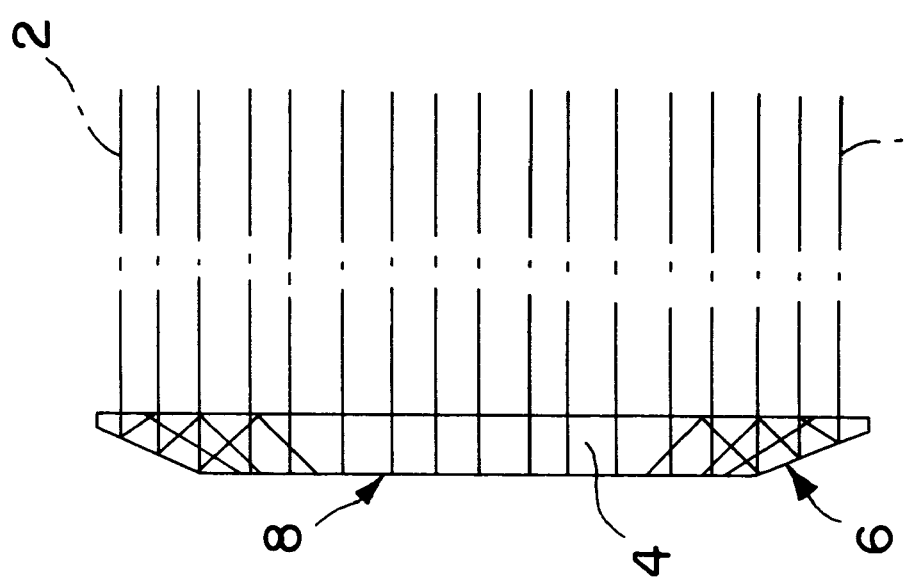
FIG. 1A illustrates a side elevational view of a modular immersed concentrating solar cell.

FIG. 1 shows the configuration of a typical concentrating element, having dimensions of 6.9 mm.×6.9 mm. The concentration is achieved by using a folded mirror system, which, if operated with air or vacuum between the elements, would produce obscuration by the secondary folding mirror as in a classic "Cassegrainian" system in which a parabolic concave primary mirror converges light on a hyperbolic convex secondary mirror, which redirects the light to a focus near the center of the primary mirror. Since the secondary mirror is opaque in such a system, there will be obscuration of some rays, resulting in a loss of optical energy reaching the focal plane.

However, in an immersed system as shown in FIG. 1, rays 2 entering the optic 4, which, in this case, is fused silica having a refraction index of 1.485, are reflected from a silvered reflective surface 6 that they strike. If the reflected ray in the fused silica reaches the front surface (unsilvered) at an angle to its normal greater than 42°, total internal reflection takes place, and the ray is directed back toward the primary surface. If a photovoltaic solar cell 8 having a refractive index equal to or larger than 1.485 (or whatever the refractive index of the optic is), the ray will be absorbed by the cell and will generate electricity. This is true at any angle up to 90° relative to the normal to the immersion surface.

The first reflective surface, which is silvered, can take the shape of any surface (pyramid, cone, sphere, paraboloid). In this case, an optimization analysis concludes that this reflective surface should be a pyramid, which provides the thinnest possible optical element, thus saving weight. Furthermore, since solar arrays are arranged in a Cartesian grid fashion, a square cross-section, rather than round, was found to be preferable. There is no obscuration in this system since rays which do not hit the silvered surface hit the solar cell so that there is no area of the entrance aperture that is obscured for near normal incidence rays to the entrance aperture. As the rays deviate from normal, the reflected rays from one facet of the pyramid do not exceed 42° and they therefore escape through the front aperture, and do not reach the solar cell. However, since a concentrating solar panel must track the sun to some degree, this small loss does not apply to a system which properly tracks the sun. This feature is advantageous for spacecraft which require power before the solar tracking system has locked-on to the sun. In this system, the degraded power for off-axis pointing is only approximately 20% while for conventional tracking systems the off-axis power drops to near zero.

Figure 2C:
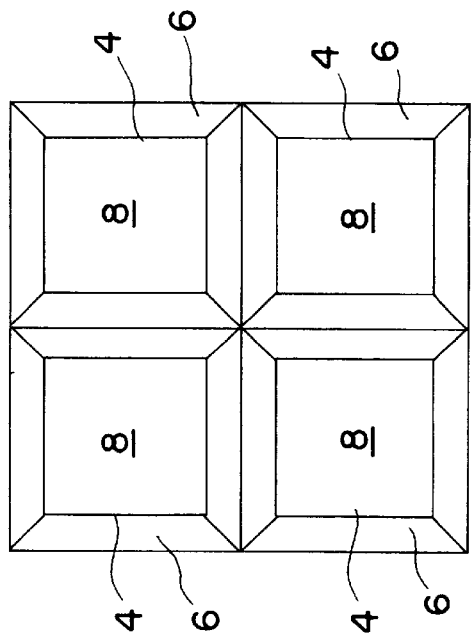
FIG. 2C illustrates an elevational view showing the opposed side of FIG. 2A, in accordance with the first embodiment of the present invention.
Figure 2B:
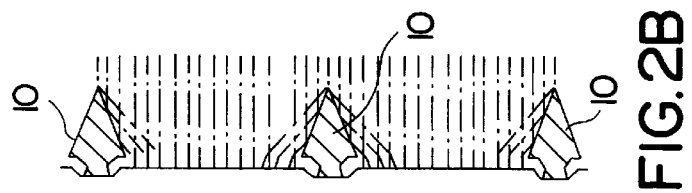
FIG. 2B illustrates a side elevational view of FIG. 2A illustrating the configuration of the power leads.
Figure 2A:
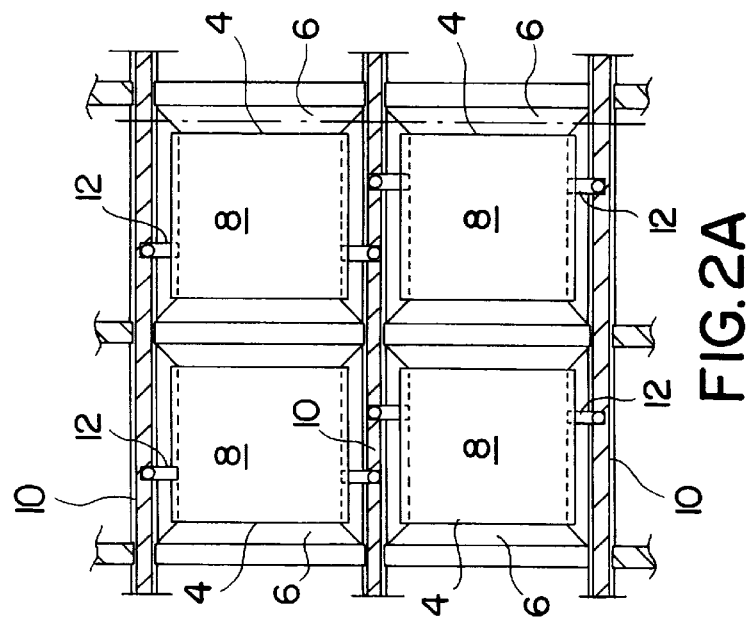
FIG. 2A illustrates an elevational view of an immersed solar power system showing a mounting grid and power leads.

The arrangement of the modular cells in a two dimensional solar panel is shown in FIG. 2. In this design, the square "honeycomb" grid used in most solar panels provides additional optical concentration in addition to providing the required stiffness and strength to hold the cells in a single panel, a plurality of said panels being tied together and folded accordion style against the side of the payload during launch.

As can be seen in FIG. 2, for a nominal 6.9 mm.×6.9 mm. concentrating optic exterior dimension, the grid spacing is 7.25 mm.×7.25 mm. This allows a 0.35 mm. grid dimension between adjacent cells and allows the two piece grid construction shown in FIG. 2. The aluminum extruded "c" section 10 is an effective "clip" which slips over the "dovetail" mounting rail of the anodized aluminum pyramidal reflector grid, and for the continuous length piece equal to the width of the solar panel (one to two meters), this "c" section also accomplishes the function of an electrical power conductor for the electrical energy generated by the linear array of cells adjacent to it. In the orthogonal direction, there is no "c" section required to retain the cells, and the anodizing coating of the aluminum grid prevents shorting out the plus and minus power busses.

A GaAs cell at full load produces approximately 0.8 volts d.c. Therefore, this voltage will appear between the plus and minus bus "c section" rails. For a 1 meter wide panel, there will be 138 cells in parallel, which will have an output current capability of 2.34 amperes. Since typical solar panels are designed to produce high voltages at low currents, at a 100 volt output, 43 of these bus bar pairs will be connected in series at the edge of the solar panel, and these series combinations will be connected in parallel with other sets of 43 bus bar pairs at the edge of the solar panel to produce the total power output of the solar panel.

Solar Panel Fabrication Process

For the nominal size of the concentrator cell shown in FIGS. 1 and 2, there are 19,000 cells required for a 1 meter×1 meter solar panel. It is therefore impractical to hand assemble such a solar panel. As will be seen in the calculation of the Figure of Merit for this solar power system, the weight and Figure of Merit is directly proportional to the thickness of the fused silica concentrating optic/solar cell substrate. Therefore, to maximize the Figure of Merit, a nominal 5 mm.×5 mm. solar cell dimension has been selected, as shown in FIG. 6. If this dimension is increased to 1.0 cm.×1.0 cm., then the number of cells in a 1.0 meter×1.0 meter panel is reduced by 4/1 to only 4756 cells, but the Figure of Merit degrades by 2/1. Even for 4756 cells, an automated assembly system is necessary.

The automated assembly system for fabricating solar panels in accordance with the present invention uses the technology already developed by the electronics/TV industry, in which printed circuit boards are automatically populated by components using robot driven "pick and place" equipment in which components are taken by a robot arm, which has a vacuum chuck, and is placed into its prescribed location on the printed circuit board to an accuracy of ±25 microns. This technology is already highly developed for printed circuit boards of up to 30 cm.×30 cm.

For the solar panel manufacturing process proposed for this system, similar pick and place machines will be designed. These machines will first place the fused silica optical elements (without the solar cells) into a carbon fiber epoxy grid. Then, the machine will deposit the required amount of immersion medium (of which a suitable example is Dow Corning silicone No. 93-500 which is already approved by NASA for long term space use) on each of the optical elements. During the pot life of this silicone material, the machine will mount the cells on the wet fused silica to a precision of ±50 microns, thus achieving optical immersion.

As can be seen in FIGS. 1 and 6, each cell 8 will already have two gold ribbon electrical leads 12 attached to it. These two leads will lie on the surface of the gold plated aluminum bus bars 10 as shown in FIG. 2 when the cells are placed on the optics for immersion. After the silicone has fully cured, the same machine will ball-bond the leads to the bus bars using known techniques, thus completing the fabrication of the solar panel in a fully automated process.

Description of Design No. 2 (17 mm.×17 mm. GaAs Cells)

In Design No. 1 described above, 19,000 cells are required for a 1.0×1.0 meter$^2$ solar panel. This makes the solar panel assembly process complicated, and requires 38,000 ball-bonded joints to be successfully made if the full power capability of the solar panel is to be realized. Also, because of the small cell size, the positioning tolerances of the cell placement machinery must be commensurately small. However, the solar panel advantageously is very thin, having a thickness of about 2.1 mm. An alternate configuration of this design uses much larger 17 mm.×17 mm. GaAs cells in a 2.88/1 pyramidal concentrator, and reduces the number of cells per 1 m$^2$ panel to only 1076 cells, thereby reducing the solar panel assembly complexity by a factor of almost 20/1.

In this alternate configuration, in order to reduce the thickness of the fused silica immersion element, it does not act as a concentrating optic, and functions only as a structural substrate for the GaAs cell as well as a window and radiation shield. The optical concentration is achieved in this design by the pyramidal reflective structural grid. As can be seen in FIGS. 3, 4 and 5, the assembly technique is closely similar to that of Design No. 1, except the concentrating grid is made of an aluminum thin wall structure 14 fabricated by stamping, pressure-forming, dip-brazing techniques or investment casting. At present, the preferred method of fabrication of this design is stamping.

There are three advantages applicable to the methods of construction of the second design:

1. The stamping or pressure forming method can be made very low cost in quantity production.

2. If aluminum or magnesium sheet metal is used in these processes, it can be polished before forming, and can be clear anodized after forming to produce a high emissivity surface on the reflector to facilitate heat dissipation of the solar cells into the forward hemisphere.

3. The 10 mm. thickness of the waffle grid makes it extremely rigid as compared to current solar panels.

If an investment casting process is used, the mold must have an adequately high polish so as to produce specular reflection for the pyramidal concentrator.

The assembly technique for this alternate design is shown in FIGS. 3–5. The completed solar panel is composed of four components, assembled in the following order:

1. The "honeycomb" pyramidal aluminum or magnesium grid structure 15;
2. The solar cell fused silica substrates 16;
3. The solar cells 18;
4. The power bus/cell retainers 20.

Ideally, the grid structure is formed in 1 meter×1 meter sections, or smaller sections could be precisely welded together to form the 1 meter×1 meter larger sections.

The one meter long power bus/cell retainers are precoated with bonding cement at the joining surfaces shown by reference numeral 22 in FIG. 3, and manually mounted on the grid.

Using the "Pick and Place" equipment described above, the GaAs solar cells, pre-coated with the silicone adhesive, are then mounted and immersed on the rear surface of the fused silica substrates.

The final step in the assembly is the ball bonding of the two gold electrical leads of each cell to the gold-plated aluminum/magnesium bus bar/cell retainers, and the connection of the positive and negative bus bars in series/parallel grids to achieve the high voltage/current configuration of the completed solar panel.

CALCULATION OF FIGURE OF MERIT FOR BOTH DESIGNS

Design No. 1

For the GaAs solar cell having dimensions of 5.0 mm.× 5.0 mm., the entrance aperture is 0.563 cm$^2$. The 0.137 w/cm$^2$ solar irradiance entering this aperture is 0.077 watt.

By anti-reflection coating the front surface of the fused silica optic, >98% passes through, so that 0.075 watt reaches either the solar cell directly, or reflects from the silvered reflective surfaces.

The power reaching the cell directly=0.0343 watts.

The aperture area having one reflection amounts to 0.17 cm$^2$. With a silver reflectance of 0.95, the power reaching the cell after one reflection is 0.023 watts. The remaining power reaches the cell after two reflections and has an aperture area of 0.056 cm$^2$ and has a reflectance of 0.9. This dual reflected power is 0.0069 watts.

The total power reaching the cell is therefore 0.0343+ 0.023+0.0069=0.0642 watts.

Conservatively assuming a 20% efficiency for the GaAs cell, the electrical energy generated is 0.0128 watts.

The weight of the assembly shown in FIG. 2 is comprised of:

Fused silica optic (density 2.2 gm/cc)+mass of GaAs cells=0.0297+0.011+0.019 gram=0.0594 gram;

The grid assembly (density 3 gms/cc) weighs 0.0417 gram for each element;

The total mass per element is therefore: 0.0594+0.0417= 0.101 gram;

FIGURE OF MERIT=0.0128/0.101=0.1267 watt/gram= 126.7 watts/Kg.

In this configuration, the stiffness of the solar panel is maintained by the grid structure, which is equivalent to a "honeycomb" construction, used extensively in the aerospace industry because of its very high stiffness-to-weight ratio. The solar cell/optic assemblies are not part of this structure, since they simply "nest" inside this honeycomb structure.

The Figure of Merit varies inversely with the linear dimension of the solar cell. This is true because if the linear cell dimension is doubled to 1.0 cm., the received power is increased by 4/1 but the volume and weight of the elemental assembly increases by 8/1 because of the required doubling of the thickness of all components (except the solar cell), so that the Figure of Merit degrades by 2/1.

Design No. 2

For the GaAs solar cell having dimensions of 1.7 cm.×1.7 cm., the entrance aperture is 2.9 cm$^2$. The 0.137 w/cm$^2$ solar irradiance entering this aperture is 0.398 watt. By anti-reflection coating the front surface of the fused silica optic, >98% passes through, so that 0.390 watts reaches the solar cell directly.

The aperture area having one reflection amounts to 3.68 cm$^2$. With an aluminum reflectance of 0.95, the power reaching the cell after one reflection is 0.494 watts.

The total power reaching the cell is therefore 0.390+ 0.494=0.884 watts.

Conservatively assuming a 20% efficiency for the GaAs cell, the electrical energy generated is 0.177 watts.

The weight of the assembly shown in FIG. 2 is comprised of:

Fused silica substrate (density 2.2 gm/cc)+mass of GaAs cells=0.32+0.17+0.019 grams=0.51 grams.

The grid assembly (density 3 gms/cc) weighs 0.454 grams for each element;

The electrical bus/cell retainers (density 3 gms/cc) weighs 0.468 gram for each element.

The total mass per element is therefore: 0.51+0.454 +0.468=1.433 grams.

FIGURE OF MERIT=0.177/1.433=0.1235 watt/gm.=123.5 watts/Kg.

If magnesium is used for the reflector and the electrical busses, the weight of these elements reduces by ⅓ and:
FIGURE OF MERIT=0.177/1.118=0.1582 watt/gm=158.2 watts/Kg.

Survivability of These Designs in the Space Environment

Even though the temperature coefficient of expansion of the aluminum grid structure is much larger than that of the fused silica optical elements, this is not a significant problem because there is no physical bonding of the cells to the aluminum grid structure. The cells are only clamped in by the retainer/bus bars and are free to thermally "breathe" in the presence of grid dimensional changes due to temperature. The gold electrical leads are subject to very little stress since the cells "ride" with the substrate during temperature changes, and the small dimensional changes over the 17 mm. dimension of the cell substrate are well within the flexural capabilities of the gold ribbon leads. Therefore in the large temperature swings applicable to solar panels when the sun sets behind the earth, minimum stress is applied to these optical elements and their solar cells. Because of the small dimensions of the solar cells and the resilient nature of the silicone immersion medium, minimum temperature stress will be applied to the immersion interface.

The survivability of the solar cells to ionizing Van Allen radiation in space should be greatly improved with this system because the immersion optic replaces the cover glass used in present solar cells, but is 4 to 5 times thicker, thus reducing the degradation to the cells commensurately. The rear surface of the cells is protected by the germanium substrate presently used for the GaAs cells. Additional shielding is also provided by the grid structure.

Other objects, modifications and advantages within the scope of the present invention will become apparent to those skilled in the art. Accordingly, the description of the best modes of the invention is intended to be illustrative and not restrictive of the scope of the invention, that scope being defined by the following claims and all equivalents thereto.

I claim:

1. A solar power system comprising at least one solar cell for converting optical energy into electrical energy, said at least one solar cell being disposed in an immersion medium having a predetermined refractive index, said immersion medium defining at least first and second zones; said first zone being disposed substantially in linear alignment with said solar cell such that light rays incident on said first zone are directed onto said solar cell; said second zone merging from said first zone and extending beyond said solar cell; said second zone including, at least in part, light reflective means; said second zone and said solar cell being arranged such that light rays incident to said reflective means are reflected by said reflective means and thereafter redirected towards said solar cell as a result of total internal reflection by said immersion medium.

2. The solar power system as claimed in claim 1 wherein said reflective means is formed from a silver coating applied to a surface of said second zone.

3. The solar power system as claimed in claim 1 wherein the portion of said second zone including said reflective means is pyramidal in configuration.

4. The solar power system as claimed in claim 1 wherein said immersion medium includes silicone.

5. The solar power system as claimed in claim 4 wherein said immersion medium is fused silicon.

6. The solar power system as claimed in claim 1 wherein said first zone is substantially square in configuration.

7. The solar power system as claimed in claim 6 wherein said second zone defines a border around the periphery of said first zone.

8. The solar power system as claimed in claim 1 further including means for coupling together a plurality of said solar cells in said immersion medium.

9. The solar power system as claimed in claim 8 wherein said means for coupling comprises electrical transmission means for transmitting electrical current from said plurality of solar cells.

10. The solar power system as claimed in claim 9 wherein said means for coupling is disposed between said second zones of said immersion medium of adjacent solar cells coupled together.

11. The solar power system as claimed in claim 9 further including at least one electrical connector element disposed between at least one solar cell and said means for coupling to provide an electrical connection between said at least one solar cell and said means for coupling.

12. The solar power system as claimed in claim 11 wherein said at least one electrical connector element is a gold lead, and the portion of said means for coupling engaged by said lead is gold plated.

13. The solar power system as claimed in claim 9 wherein said plurality of said solar cells and said immersion medium are coupled together in a substantially planar arrangement.

14. The solar power system as claimed in claim 13 wherein said means for coupling is a bus bar extending longitudinally with said plurality of solar cells coupled together.

15. The solar power system as claimed in claim 14 wherein said bus bar is aluminum.

16. A method for fabricating a solar power system, said method including the steps of depositing an immersion medium on at least one solar cell for defining said first and second zones; said first zone being disposed substantially in linear alignment with said solar cell, and said second zone merging from said first zone and extending beyond said solar cell; and providing at least a portion of said second zone with a reflective layer such that light incident on said second zone is reflected therefrom and redirected towards said solar cell as a result of total internal reflection by said immersion medium.

17. The method as claimed in claim 16 further including the step of coupling a plurality of said solar cells together by coupling means comprising electrical conductor means for transmitting electrical current generated by at least one of said solar cells coupled together.

18. The method as claimed in claim 17 further including the step of connecting at least one electrical lead extending from said at least one solar cell to said electrical conductor means.

19. A solar power system comprising a plurality of solar cells for converting optical energy into electrical energy, each of said plurality of solar cells being disposed in an immersion medium having a predetermined refractive index, and means for coupling said plurality of solar cells together, said means for coupling including electrical conductor means for transmitting electrical current generated by said plurality of solar cells.

20. The solar power system as claimed in claim 19 further including at least one electrical lead disposed between at least one of said solar cells and said electrical conductor means for providing an electrical connection between said at least one solar cell and said electrical conductor means.

* * * * *